(12) United States Patent
Takechi et al.

(10) Patent No.: US 12,471,319 B2
(45) Date of Patent: Nov. 11, 2025

(54) THIN-FILM TRANSISTOR SUBSTRATE WITH IMPURITY CONCENTRATION PROFILE IN LAYERING DIRECTION HAVING PEAK OUTSIDE SEMICONDUCTOR LAYER

(71) Applicant: WUHAN TIANMA MICRO-ELECTRONICS CO., LTD., Wuhan (CN)

(72) Inventors: Kazushige Takechi, Kanagawa (JP); Kenji Sera, Kanagawa (JP); Jun Tanaka, Kanagawa (JP); Shui He, Xiamen (CN); FeiPeng Lin, Xiamen (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 726 days.

(21) Appl. No.: 17/699,587

(22) Filed: Mar. 21, 2022

(65) Prior Publication Data
US 2022/0302313 A1 Sep. 22, 2022

(30) Foreign Application Priority Data
Mar. 22, 2021 (JP) ................. 2021-047947

(51) Int. Cl.
H10D 30/67 (2025.01)
(52) U.S. Cl.
CPC ..... H10D 30/6755 (2025.01); H10D 30/6731 (2025.01); H10D 30/6745 (2025.01); H10D 30/6757 (2025.01)
(58) Field of Classification Search
CPC ........... H10D 30/6755; H10D 30/6731; H10D 30/6745; H10D 30/6757; H10D 84/0109;
(Continued)

(56) References Cited

U.S. PATENT DOCUMENTS 8,247,273 B2 8/2012 Makita et al.
2010/0127329 A1 5/2010 Park et al.
(Continued)

FOREIGN PATENT DOCUMENTS

| CN | 101743629 A | 6/2010 |
| JP | 2005079319 A | 3/2005 |
| KR | 20030081894 A | 10/2003 |

OTHER PUBLICATIONS

Office Action, issued in Chinese Patent Application No. 202210264790.9 dated Jan. 24, 2025.

*Primary Examiner* — Davienne N Monbleau
*Assistant Examiner* — John Patrick Cornely
(74) *Attorney, Agent, or Firm* — NIXON & VANDERHYE

(57) ABSTRACT

A thin-film transistor substrate includes an insulating substrate, a conductor layer including a top-gate electrode part of an oxide semiconductor thin-film transistor, an oxide semiconductor layer located lower than the top-gate electrode part and including a channel region of the oxide semiconductor thin-film transistor, and an upper insulating layer located between the conductor layer and the oxide semiconductor layer. The oxide semiconductor layer includes low-resistive regions lower in resistance than the channel region. The low-resistive regions sandwich the channel region in an in-plane direction of the insulating substrate and contain impurities to cause resistance reduction of the low-resistive regions. A concentration profile in a layering direction of the impurities to cause resistance reduction of the low resistive regions has one or more peaks. The one or more peaks are located outside the oxide semiconductor layer.

6 Claims, 16 Drawing Sheets

(58) Field of Classification Search
CPC .............. H10D 84/953; H10D 10/821; H10D 30/6713; H10D 86/481; H10D 86/423; H10D 86/60; H10D 99/00; H10D 30/6711; H10D 30/6715; A01G 13/20; A61K 40/40; H10F 30/222; H10K 59/1213
See application file for complete search history.

(56) References Cited

U.S. PATENT DOCUMENTS

| | | | |
|---|---|---|---|
| 2010/0181575 A1* | 7/2010 | Makita | H01L 29/78618 257/E21.414 |
| 2011/0012106 A1 | 1/2011 | Yamazaki et al. | |
| 2012/0161121 A1* | 6/2012 | Yamazaki | H01L 29/78621 257/E21.409 |
| 2020/0219954 A1 | 7/2020 | Jeong et al. | |
| 2021/0005693 A1* | 1/2021 | Cho | H10K 59/1213 |

* cited by examiner

RELATED ART EXAMPLE

THIN-FILM TRANSISTOR SUBSTRATE WITH IMPURITY CONCENTRATION PROFILE IN LAYERING DIRECTION HAVING PEAK OUTSIDE SEMICONDUCTOR LAYER

CROSS-REFERENCE TO RELATED APPLICATIONS

This non-provisional application claims priority under 35 U.S.C. § 119(a) on Patent Application No. 2021-047947 filed in Japan on Mar. 22, 2021, the entire content of which is hereby incorporated by reference.

BACKGROUND

This disclosure relates to a thin-film transistor substrate.

A technology of incorporating a low-temperature polysilicon thin-film transistor (LTPS TFT) and an oxide semiconductor TFT into one circuit is available for practical use. For example, pixel circuits including a low-temperature polysilicon TFT and an oxide semiconductor TFT are proposed. Incorporating a low-temperature polysilicon TFT having high mobility and an oxide semiconductor TFT that generates small leakage current in a circuit achieves improvement in characteristics and reduction in power consumption of the circuit.

The semiconductor layer of an oxide semiconductor TFT includes a channel region and source/drain regions sandwiching the channel region. The source/drain regions are low-resistive regions having a resistance lower than the resistance of the channel region. The low-resistive regions can be produced by exposing an oxide semiconductor layer to plasma of a specific element or doping the oxide semiconductor layer with impurity ions by ion implantation.

SUMMARY

A thin-film transistor substrate according to an aspect of this disclosure includes an insulating substrate, a conductor layer including a top-gate electrode part of an oxide semiconductor thin-film transistor, an oxide semiconductor layer located lower than the top-gate electrode part and including a channel region of the oxide semiconductor thin-film transistor, and an upper insulating layer located between the conductor layer and the oxide semiconductor layer. The oxide semiconductor layer includes low-resistive regions lower in resistance than the channel region. The low-resistive regions sandwich the channel region in an in-plane direction of the insulating substrate and contain impurities to cause resistance reduction of the low-resistive regions. A concentration profile in a layering direction of the impurities to cause resistance reduction of the low resistive regions has one or more peaks. The one or more peaks are located outside the oxide semiconductor layer.

It is to be understood that both the foregoing general description and the following detailed description are exemplary and explanatory and are not restrictive of this disclosure.

EMBODIMENTS

Figure 1:
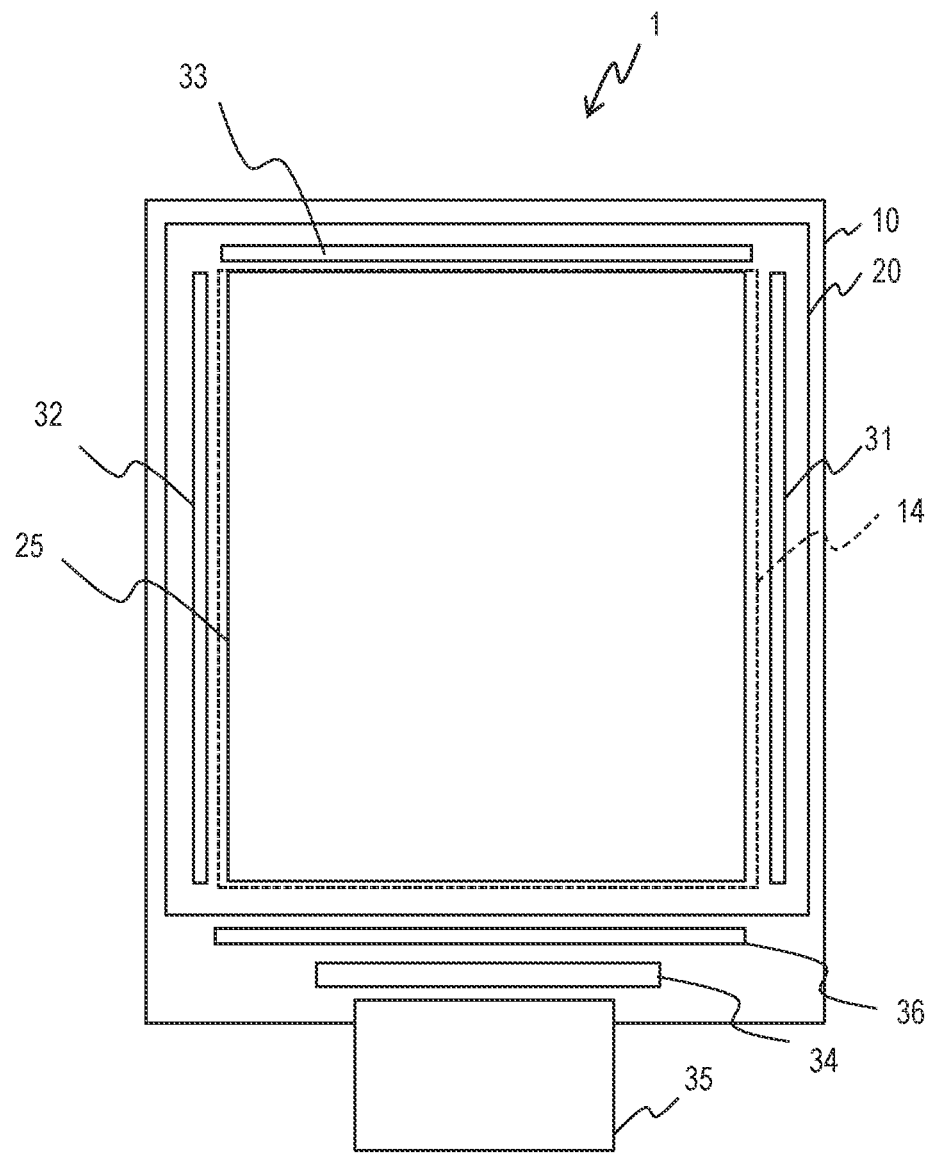
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Some elements in the drawings are exaggerated in size or shape for clear understanding of the description.

Overview

The following description employs an organic light-emitting diode (OLED) display device as an example of a device including a thin-film transistor substrate. The OLED display device in this disclosure includes a low-temperature polysilicon thin-film transistor (LTPS TFT) and an oxide semiconductor TFT in a pixel circuit and/or a peripheral circuit. An example of the oxide semiconductor is indium gallium zinc oxide (IGZO). The thin-film transistor substrate can be used in not only an OLED display device but also a flat panel display such as a liquid crystal display device or an electronic device such as a memory device or a high-voltage device.

An oxide semiconductor TFT generates small leakage current and accordingly, it can be used as a switch transistor connected with a storage capacitor (capacitive element) for maintaining a gate potential of a driving transistor in a pixel circuit, for example. A low-temperature polysilicon TFT having high mobility can be used as a driving transistor, for example. The configurations disclosed herein are applicable to devices other than display devices.

The oxide semiconductor layer in an embodiment of this specification is reduced in resistance by being doped with impurity ions. The regions reduced in resistance include the source/drain regions of an oxide semiconductor TFT. In reducing the resistance of the oxide semiconductor layer, it is important to maintain the channel length as designed. Accordingly, when ion implantation is employed to reduce the resistance of the oxide semiconductor layer, precisely controlling the concentration profile of implanted ions is important. If the concentration of the impurities remaining in the oxide semiconductor layer is too high, the channel length could become short, causing malfunction to the TFT having the short channel.

The concentration profile of impurities in the layering direction in an embodiment of this specification has one or more peaks and the one or more peaks are located outside the oxide semiconductor layer. Dislocating the peaks of the impurity concentration profile from the oxide semiconductor layer facilitates production of desirable low-resistive oxide semiconductor regions.

The oxide semiconductor layer in an embodiment of this specification includes a transition region extending outward from an end of a top-gate electrode part. In the transition region, the carrier density increases as getting away from the top gate electrode part. This configuration provides characteristics more appropriate for the oxide semiconductor TFT. The dC/dV value obtained by SCM analysis of this transition region has a negative minimum value. Specifically, the dC/dV value at the end of the top gate electrode part is a negative value. It decreases to the minimum value and then increases as the distance from the top gate electrode part increases. The dC/dV value reaches the zero value outside the transition region. This configuration provides characteristics yet more appropriate for the oxide semiconductor TFT.

Configuration of Display Device

FIG. 1 schematically illustrates a configuration example of an OLED display device 1. The OLED display device 1 includes a thin-film transistor (TFT) substrate 10 on which organic light-emitting elements (OLED elements) and pixel circuits are fabricated, a thin-film encapsulation (TFE) 20 for encapsulating the organic light-emitting elements. The thin-film encapsulation 20 is a kind of structural encapsulation unit. Another example of a structural encapsulation unit is an encapsulation substrate for encapsulating organic light-emitting elements and a bond (glass frit sealer) for bonding the TFT substrate 10 with the encapsulation substrate. The space between the TFT substrate 10 and the encapsulation substrate is filled with dry nitrogen, for example.

In the periphery of a cathode electrode region 14 outer than the display region 25 of the TFT substrate 10, a scanning driver 31, an emission driver 32, a protection circuit 33, a driver IC 34, and a demultiplexer 36 are provided. The driver IC 34 is connected to the external devices via flexible printed circuits (FPC) 35. The scanning driver 31, the emission driver 32, and the protection circuit 33 are peripheral circuits fabricated on the TFT substrate 10.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The protection circuit 33 protects the elements in the pixel circuits from electrostatic discharge. The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in series (d is an integer larger than 1). The demultiplexer 36 changes the data line to output the data signal from the driver IC 34 $d$ times per scanning period to drive d times as many data lines as output pins of the driver IC 34.

Configuration of Pixel Circuit

Figure 2:
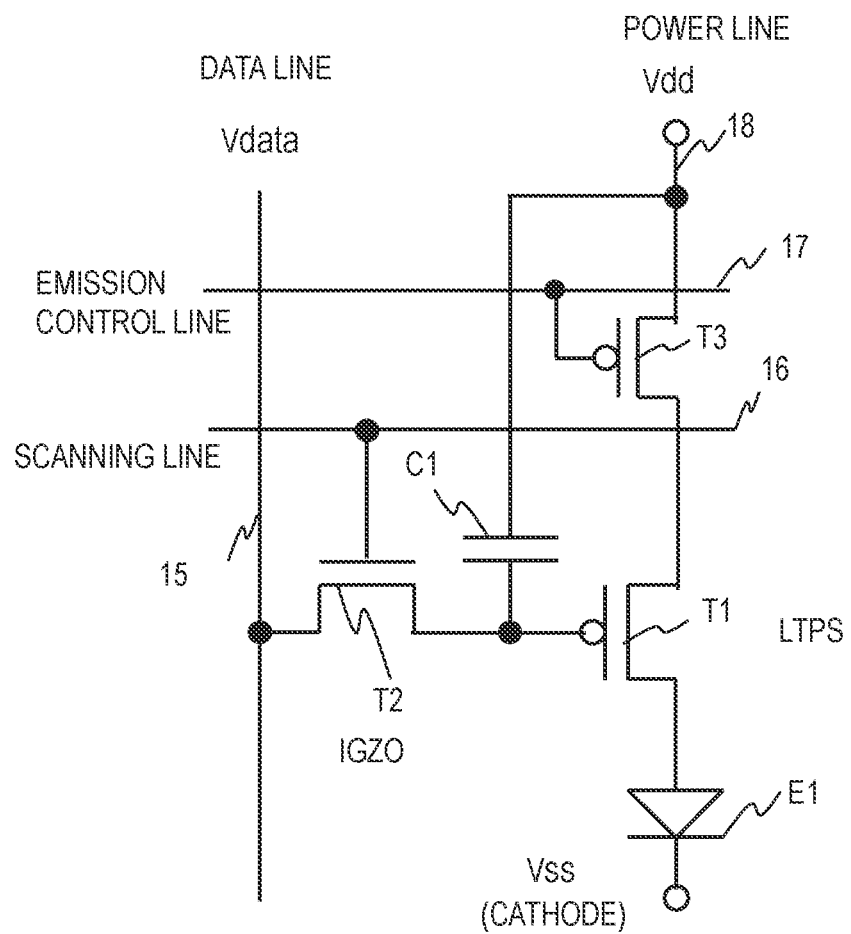
FIG. 2 illustrates a configuration example of a pixel circuit.

A plurality of pixel circuits are fabricated on the TFT substrate 10 to control electric current to be supplied to the anode electrode parts of subpixels (also simply referred to as pixels). FIG. 2 illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs. The transistors except for the driving transistor T1 are switch transistors.

The selection transistor T2 is a switch for selecting the subpixel. The selection transistor T2 is an n-channel type of oxide semiconductor TFT and its gate terminal is connected with a scanning line 16. The source terminal is connected with a data line 15. The drain terminal is connected with the gate terminal of the driving transistor T1.

The driving transistor T1 is a transistor (driving TFT) for driving the OLED element E1. The driving transistor T1 is a p-channel type of low-temperature polysilicon TFT and its gate terminal is connected with the drain terminal of the selection transistor T2. The source terminal of the driving transistor T1 is connected with the drain terminal of the emission transistor T3 and the drain terminal of the driving transistor T1 is connected with the OLED element E1. The storage capacitor C1 is provided between the gate terminal of the driving transistor T1 and a power line 18.

The emission transistor T3 is a switch for controlling supply/stop of the driving current to the OLED element E1. The emission transistor T3 is a p-channel type of low-temperature polysilicon TFT and its gate terminal is connected with an emission control line 17. The source terminal of the emission transistor T3 is connected with the power line 18 and the drain terminal of the emission transistor T3 is connected with the source terminal of the driving transistor T1.

Next, operation of the pixel circuit is described. The scanning driver 31 outputs a selection pulse to the scanning line 16 to turn on the selection transistor T2. The data voltage supplied from the driver IC 34 through the data line 15 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 32 outputs a control signal to the emission control line 17 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3. The circuit configuration in FIG. 2 is merely an example; the pixel circuit can have a different configuration.

Configuration of TFT Substrate

Hereinafter, a configuration example of a TFT substrate including low-temperature polysilicon TFTs and oxide semiconductor TFTs is described. The oxide semiconductor can be IGZO. The configuration described in this specification is applicable to TFT substrates including TFTs of other kinds of oxide semiconductors.

Figure 3:
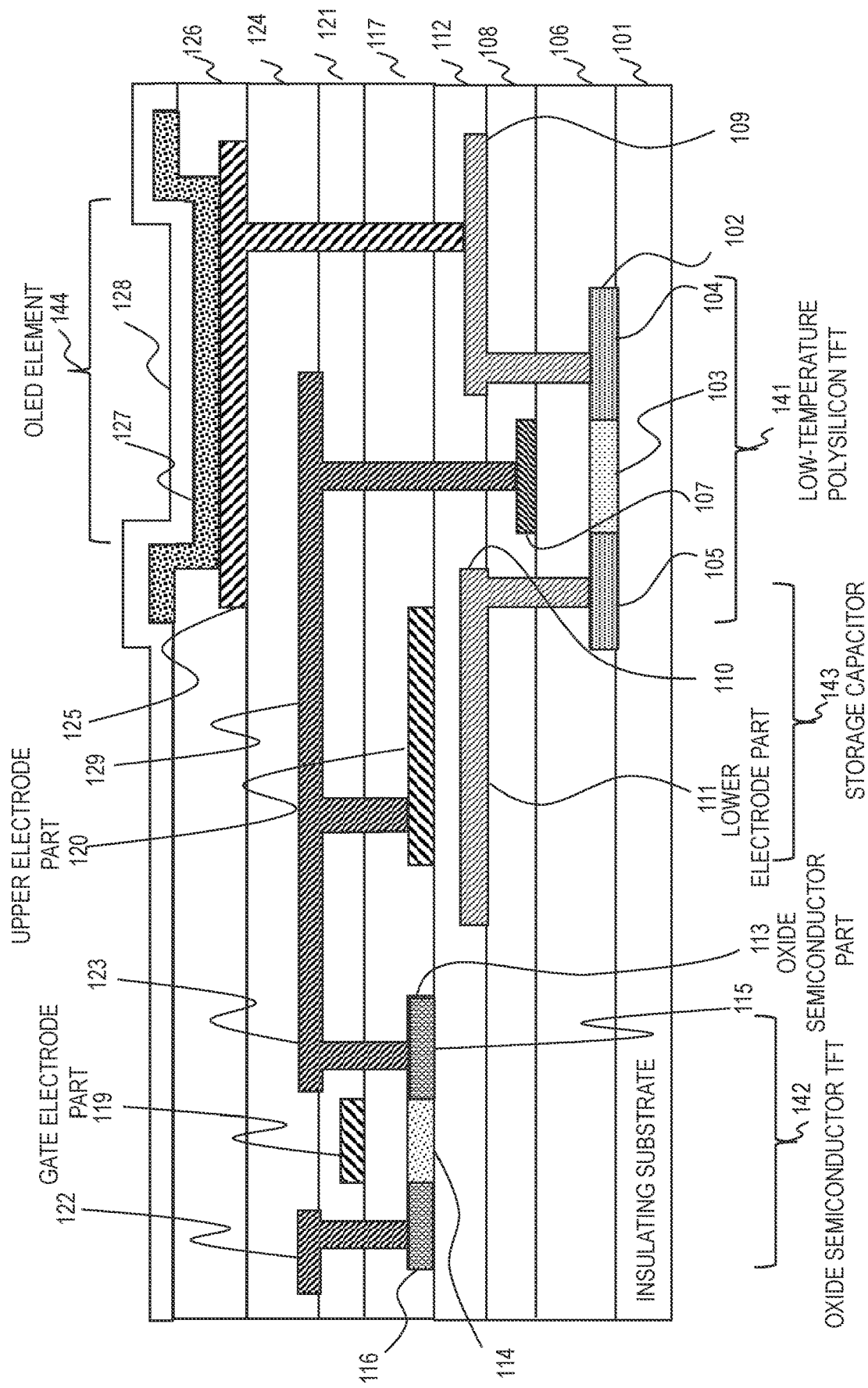
FIG. 3 schematically illustrates a cross-sectional structure of a part of a TFT substrate.

FIG. 3 schematically illustrates a cross-sectional structure of a part of a TFT substrate. A low-temperature polysilicon TFT 141, an oxide semiconductor TFT 142, a storage capacitor 143, and an OLED element 144 are fabricated on an insulating substrate 101. These elements correspond to the driving transistor T1, the selection transistor T2, the storage capacitor C1, and the OLED element E1 in FIG. 2.

The insulating substrate 101 is a flexible or inflexible substrate made of resin or glass. The low-temperature polysilicon TFT 141 includes a low-temperature polysilicon part 102. The low-temperature polysilicon part 102 is included in a low-temperature polysilicon layer and can be one island-like low-temperature polysilicon film or a part of a larger low-temperature polysilicon film. The low-temperature polysilicon part 102 includes source/drain regions 104 and 105 and a channel region 103 sandwiched between the source/drain regions 104 and 105 in an in-plane direction.

The source/drain regions 104 and 105 are made of low-temperature polysilicon reduced in resistance by being doped with high-concentration impurities; they are connected with source/drain electrode parts 109 and 110. The channel region 103 is made of low-temperature polysilicon not reduced in resistance (highly-resistive low-temperature polysilicon).

The low-temperature polysilicon part 102 is included in a low-temperature polysilicon layer. The low-temperature polysilicon layer includes the low-temperature polysilicon parts of low-temperature polysilicon TFTs in a plurality of pixel circuits. The low-temperature polysilicon layer is formed directly on the insulating substrate 101. Although the low-temperature polysilicon part 102 in the example of FIG. 3 is in contact with the insulating substrate 101, another insulating layer such as a silicon nitride layer can be provided therebetween.

The low-temperature polysilicon TFT 141 has a top-gate structure. The low-temperature polysilicon TFT 141 can have a bottom gate in addition to the top gate. The low-temperature polysilicon TFT 141 further includes a gate electrode part 107 and a gate insulating part located between the gate electrode part 107 and the channel region 103 in the layering direction. The gate insulating part is a part of an insulating layer 106 located between the gate electrode part 107 and the channel region 103. The insulating layer 106 includes the gate insulating parts of the other low-temperature polysilicon TFTs. The channel region 103, the gate insulating part, and the gate electrode part 107 are laid in this order from the bottom (the side closer to the insulating substrate 101); the gate insulating part is in contact with the channel region 103 and the gate electrode part 107.

The gate electrode part 107 is made of a conductor and included in a conductor layer. The gate electrode part 107 can be made of metal. The metal material can be selected desirably from Mo, W, Nb, and Al, for example. The insulating layer 106 in this example is made of silicon oxide.

An interlayer insulating film 108 is provided to cover the low-temperature polysilicon part 102, the gate insulating part, and the gate electrode part 107. The interlayer insulating film 108 can be a silicon nitride film. The source/drain electrode parts 109 and 110 are provided above the interlayer insulating film 108 and connected with the source/drain regions 104 and 105 via contact holes opened through the interlayer insulating film 108 and the insulating layer 106. The material for the source/drain electrode parts 109 and 110 can be Al or Ti, for example.

The storage capacitor 143 includes a lower electrode part 111, an upper electrode part 120 opposed to the lower electrode part 111, and an insulating part sandwiched between the lower electrode part 111 and the upper electrode part 120. The lower electrode part 111 is located above the interlayer insulating film 108 and continued from the source/drain electrode part 110. The lower electrode part 111 is included in the same conductor layer as the source/drain electrode parts 109 and 110.

Another interlayer insulating film 112 is laid above the interlayer insulating film 108. The interlayer insulating film 112 can be a silicon oxide film. The interlayer insulating film 112 is provided to cover the lower electrode part 111, the source/drain electrode parts 109 and 110, and the interlayer insulating film 108. The part of the interlayer insulating film 112 located between the lower electrode part 111 and the upper electrode part 120 corresponds to the insulating part.

The oxide semiconductor TFT 142 includes an oxide semiconductor part 113. The oxide semiconductor part 113 can be one oxide semiconductor film or a part of the oxide semiconductor film and includes source/drain regions 115 and 116 and a channel region 114 sandwiched between the source/drain regions 115 and 116 in an in-plane direction.

The source/drain regions 115 and 116 are made of IGZO reduced in resistance; they are connected with source/drain electrode parts 122 and 123. The channel region 114 is made of IGZO not reduced in resistance (highly resistive IGZO).

The oxide semiconductor part 113 is included in an oxide semiconductor layer. The oxide semiconductor layer includes the oxide semiconductor parts of a plurality of oxide semiconductor TFTs. The oxide semiconductor layer is provided above the interlayer insulating film 112.

The oxide semiconductor TFT 142 has a top-gate structure. The oxide semiconductor TFT 142 can have a bottom gate in addition to the top gate. The oxide semiconductor TFT 142 further includes a gate electrode part 119 and a gate insulating part located between the gate electrode part 119 and the channel region 114 in the layering direction. The gate insulating part is a part of an insulating layer 117 located between the gate electrode part 119 and the channel region 114.

The channel region 114, the gate insulating part, and the gate electrode part 119 are laid in this order from the bottom (the side closer to the insulating substrate 101); the gate insulating part is in contact with the channel region 114 and the gate electrode part 119. The gate electrode part 119 is made of a conductor and included in a conductor layer. The gate electrode part 119 can be made of metal. The metal material can be selected desirably from Mo, W, Nb, and Al, for example. The insulating layer 117 can be made of silicon oxide, for example.

Although FIG. 3 illustrates one low-temperature polysilicon TFT and one oxide semiconductor TFT, the other low-temperature polysilicon TFTs and oxide semiconductor TFTs in the pixel circuit have the same structures.

An interlayer insulating film 121 is provided to cover the oxide semiconductor part 113, the gate insulating part, and the gate electrode part 119 of the oxide semiconductor TFT 142 and the upper electrode part 120 of the storage capacitor 143. The interlayer insulating film 121 covers a part of the interlayer insulating film 112. The interlayer insulating film 121 can be a silicon oxide film.

The source/drain electrode parts 122 and 123 of the oxide semiconductor TFT 142 are provided above the interlayer insulating film 121. The source/drain electrode parts 122 and 123 are connected with the source/drain regions 115 and 116 of the oxide semiconductor TFT 142 via contact holes opened through the interlayer insulating film 121 and the insulating layer 117.

A connector 129 continued from the source/drain electrode part 123 is connected with the upper electrode part 120 of the storage capacitor 143 via a contact hole opened through the interlayer insulating film 121 and the insulating layer 117 and further connected with the gate electrode part 107 of the low-temperature polysilicon TFT 141 via a contact hole opened through the interlayer insulating films 121, 112, and 108 and the insulating layer 117.

The connector 129 interconnects the source/drain electrode part 123, the upper electrode part 120, and the gate electrode part 107. The source/drain electrode parts 122 and 123 and the connector 129 are included in a conductor layer. The material of the conductor layer is selected desirably; for example, Al or Ti can be employed.

An insulating planarization film 124 is laid to cover the exposed parts of the aforementioned conductor layer and the interlayer insulating film 121. The planarization film 124 can be made of an organic material. An anode electrode part 125 is provided above the planarization film 124. The anode electrode part 125 is connected with the source/drain electrode part 109 of the low-temperature polysilicon TFT 141 via a contact hole opened through the planarization film 124, the interlayer insulating films 121 and 112, and the insulating layer 117.

The anode electrode part 125 can include three layers of a transparent film of ITO or IZO, a reflective film of a metal such as Ag, Mg, Al, or Pt or an alloy containing such a metal, and another transparent film as mentioned above, for example. This three-layer structure of the anode electrode part 125 is merely an example; the anode electrode part 125 can have a two-layer structure.

Above the anode electrode part 125, an insulating pixel defining layer 126 is provided to isolate the OLED element 144. The pixel defining layer 126 can be made of an organic material. An organic light-emitting film 127 is provided above the anode electrode part 125. The organic light-emitting film 127 consists of, for example, a hole injection layer, a hole transport layer, a light-emitting layer, an electron transport layer, and an electron injection layer in this order from the bottom. The layered structure of the organic light-emitting film 127 is determined depending on the design.

Furthermore, a cathode electrode part 128 is provided above the organic light-emitting film 127. The cathode electrode part 128 of one OLED element 144 is a part of an unseparated conductor film. The cathode electrode part 128 transmits part of the visible light coming from the organic light-emitting film 127. The stack of the anode electrode part 125, the organic light-emitting film 127, and the cathode electrode part 128 provided within an opening of the pixel defining layer 126 corresponds to an OLED element 144.

Figure 4:
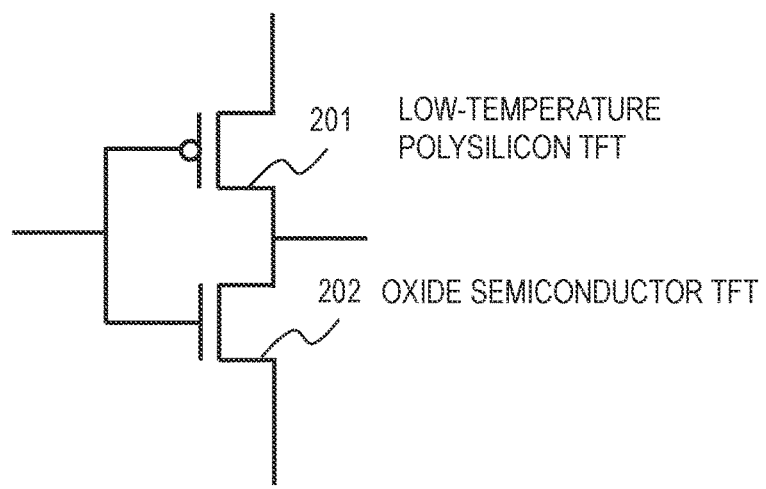
FIG. 4 illustrates an example of a CMOS circuit.

Next, a configuration of a complementary metal-oxide semiconductor (CMOS) circuit included in the driver circuit 31 or 32 on the TFT substrate is described. FIG. 4 illustrates an example of a CMOS circuit. The CMOS circuit includes a p-channel type of low-temperature polysilicon TFT 201 and an n-channel type of oxide semiconductor TFT 202. A source/drain of the low-temperature polysilicon TFT 201 is connected with a source/drain of the n-channel type of oxide semiconductor TFT 202. The gate of the low-temperature polysilicon TFT 201 and the gate of the oxide semiconductor TFT 202 are connected and they are supplied with the same signal.

Figure 5:
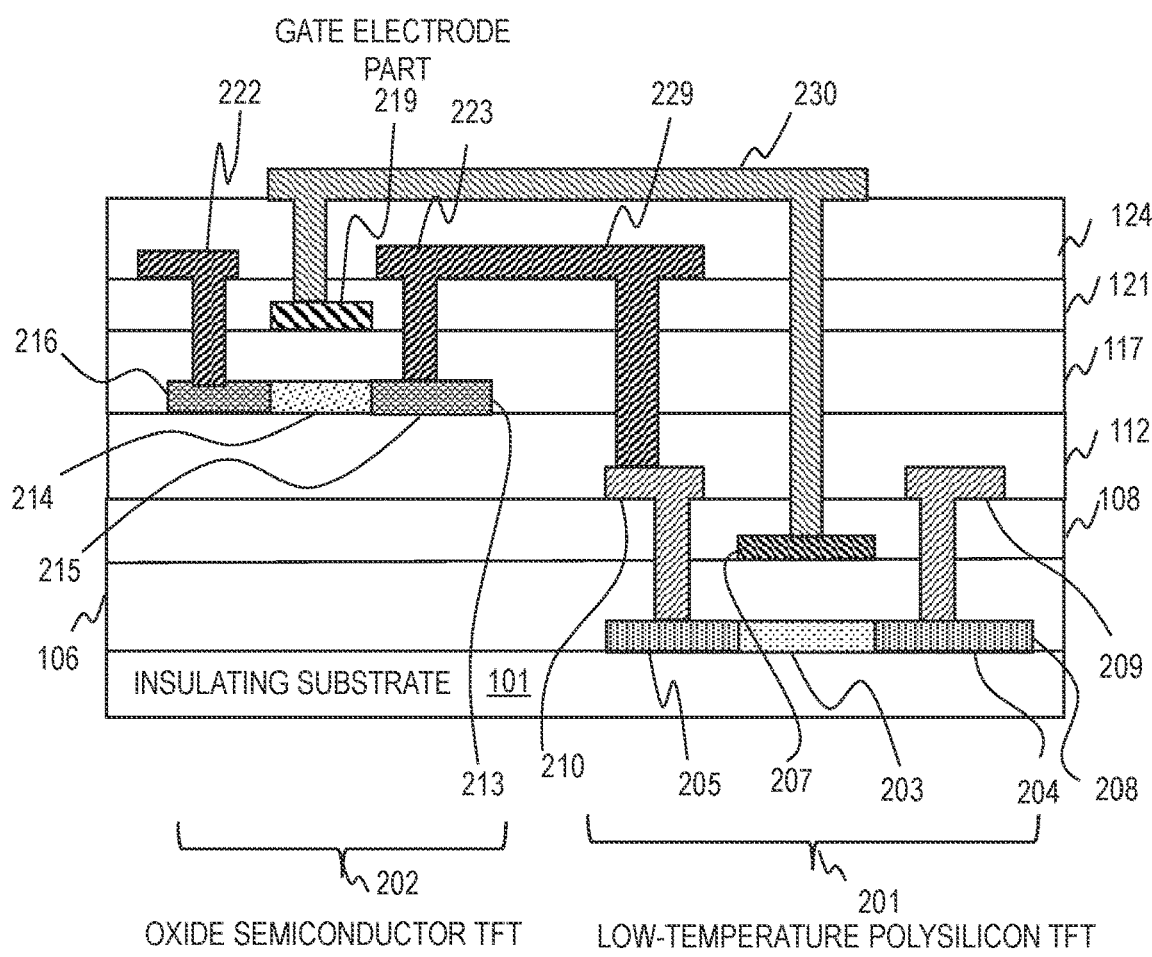
FIG. 5 schematically illustrates an example of the cross-sectional structure of a CMOS circuit.

FIG. 5 schematically illustrates an example of the cross-sectional structure of the CMOS circuit illustrated in FIG. 4. Differences from the example of the cross-sectional structure illustrated in FIG. 3 are mainly described. In the structure example of FIG. 5, the storage capacitor 143 in the structure example of FIG. 3 is excluded. Moreover, the source/drain electrode part 210 of the low-temperature polysilicon TFT 201 and the source/drain electrode part 223 of the oxide semiconductor TFT 202 are connected and further, the gate electrode part 207 and the gate electrode part 219 are connected.

The low-temperature polysilicon TFT 201 in FIG. 5 can have the same configuration as the low-temperature polysilicon TFT 141 in FIG. 3. Their sizes can be different. The low-temperature polysilicon TFT 201 includes a low-temperature polysilicon part 208, a gate insulating part, and a gate electrode part 207. The gate insulating part is a part of an insulating layer 106 located between the gate electrode part 207 and the low-temperature polysilicon part 208.

The low-temperature polysilicon part 208 includes a channel region 203 and source/drain regions 204 and 205. The source/drain electrode parts 209 and 210 are connected with the source/drain regions 204 and 205 via contact holes opened through the interlayer insulating film 108 and the insulating layer 106.

The low-temperature polysilicon part 208, the gate insulating part, the gate electrode part 207, and the source/drain electrode parts 209 and 210 respectively correspond to the low-temperature polysilicon part 102, the gate insulating part, the gate electrode part 107, and the source/drain electrode parts 109 and 110 in FIG. 3. Each element is included in the same layer as the corresponding element.

The oxide semiconductor TFT 202 in FIG. 5 can have the same configuration as the oxide semiconductor TFT 142 in FIG. 3. Their sizes can be different. The oxide semiconductor TFT 202 includes an oxide semiconductor part 213, a gate insulating part, and a gate electrode part 219. The gate insulating part is a part of an insulating layer 117 located between the gate electrode part 219 and the oxide semiconductor part 213.

The oxide semiconductor part 213 includes a channel region 214 and source/drain regions 215 and 216. The oxide semiconductor part 213, the gate insulating part, and the gate electrode part 219 respectively correspond to the oxide semiconductor part 113, the gate insulating part, and the gate electrode part 119 in FIG. 3. Each element is included in the same layer as the corresponding element.

The connector 229 is continued from the source/drain electrode part 223 of the oxide semiconductor TFT 202 and connected with the source/drain electrode part 210 of the low-temperature polysilicon TFT 201 via a contact hole opened through the interlayer insulating films 112 and 121 and the insulating layer 117. The connector 230 is connected with the gate electrode part 219 of the oxide semiconductor TFT 202 via a contact hole opened through the interlayer insulating film 121 and the planarization film 124. The connector 230 is also connected with the gate electrode part 207 of the low-temperature polysilicon TFT 201 via a contact hole opened through the interlayer insulating films 108, 112, and 121, the planarization film 124, and the insulating layer 117.

Hereinafter, examples of the method of manufacturing an oxide semiconductor TFT are described. FIGS. 6A to 6D illustrate one method, which implants impurities into the oxide semiconductor through an insulating layer. FIGS. 7A to 7D illustrate another method, which partially removes an insulating layer by etching to form a gate insulating part and implants impurities into the oxide semiconductor.

Figure 6A:
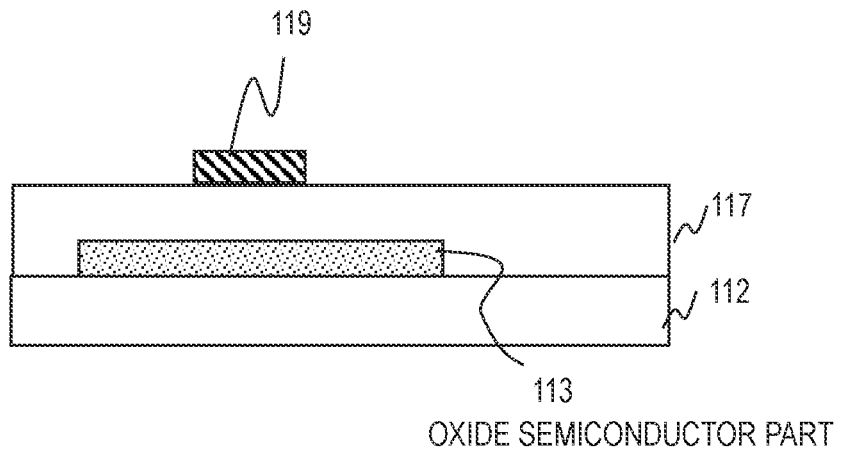
FIG. 6A illustrates an example of a method of manufacturing an oxide semiconductor TFT.

With reference to FIG. 6A, the manufacturing method produces an interlayer insulating film 112 by chemical vapor deposition (CVD) and then, produces an oxide semiconductor part 113. The oxide semiconductor part 113 can be produced by forming an oxide semiconductor layer by sputtering and patterning the oxide semiconductor layer by photolithography. Next, the manufacturing method produces an insulating layer 117 by CVD and then, produces a gate electrode part 119 by forming a metal film by sputtering and etching the metal film with a mask patterned by photolithography.

Figure 6B:
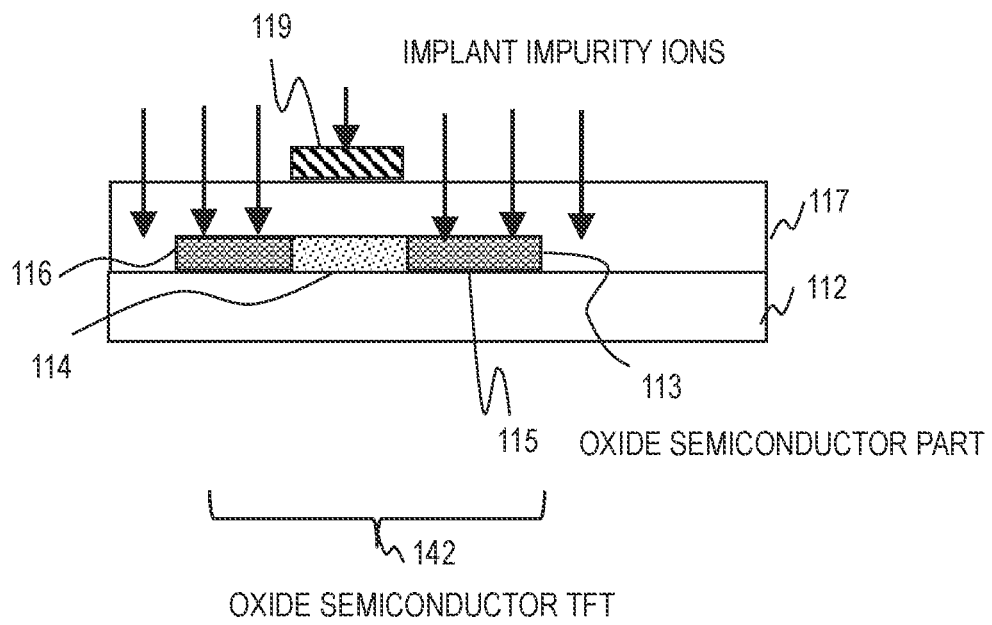
FIG. 6B illustrates an example of a method of manufacturing an oxide semiconductor TFT.

With reference to FIG. 6B, the manufacturing method implants impurities (for example, boron) into the oxide semiconductor part 113 through the insulating layer 117. The implantation of impurity ions produces source/drain regions 115 and 116 reduced in resistance in the oxide semiconductor part 113. The region between the source/drain regions 115 and 116 is a channel region 114.

The acceleration voltage for the impurity ions can be from 20 keV to 80 keV. As will be described later, the concentration profile of the impurities in an embodiment of this specification has a peak at a location outside the oxide semiconductor part 113.

Figure 6C:
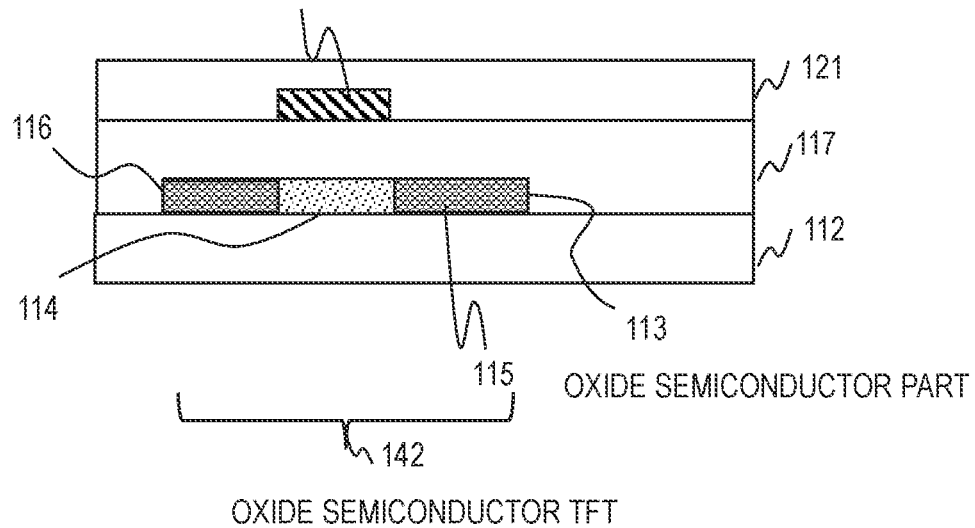
FIG. 6C illustrates an example of a method of manufacturing an oxide semiconductor TFT.
Figure 6D:
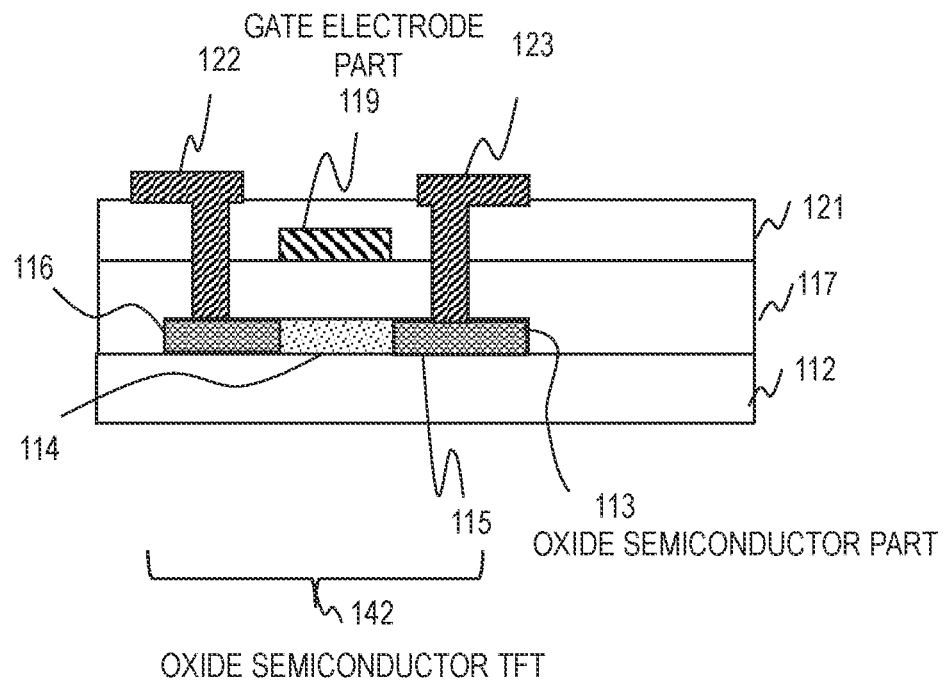
FIG. 6D illustrates an example of a method of manufacturing an oxide semiconductor TFT.

With reference to FIG. 6C, the manufacturing method produces an interlayer insulating film 121 to cover the gate electrode part 119 and the insulating layer 117. The interlayer insulating film 121 can be produced by CVD. With reference to FIG. 6D, the manufacturing method opens contact holes in the interlayer insulating film 121 and the insulating layer 117 by etching with a mask patterned by photolithography. Further, the manufacturing method deposits a metal film by sputtering and forms source/drain electrode parts 122 and 123 by etching the metal film with a mask patterned by photolithography.

Figure 7A:
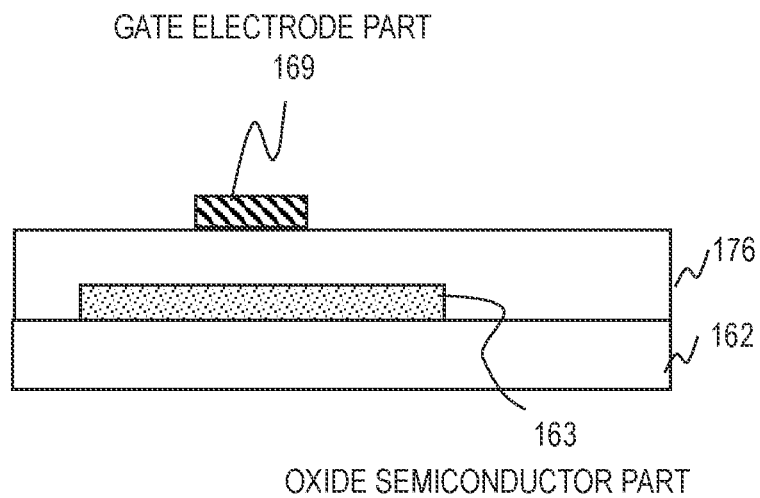
FIG. 7A illustrates another example of a method of manufacturing an oxide semiconductor TFT.

Next with reference to FIG. 7A, this manufacturing method produces an interlayer insulating film 162 by CVD and then, produces an oxide semiconductor part 163. The oxide semiconductor part 163 can be produced by forming an oxide semiconductor layer by sputtering and patterning the oxide semiconductor layer by photolithography. Next, the manufacturing method produces an insulating layer 176 by CVD and then, produces a gate electrode part 169 by forming a metal film by sputtering and etching the metal film with a mask patterned by photolithography.

Figure 7B:
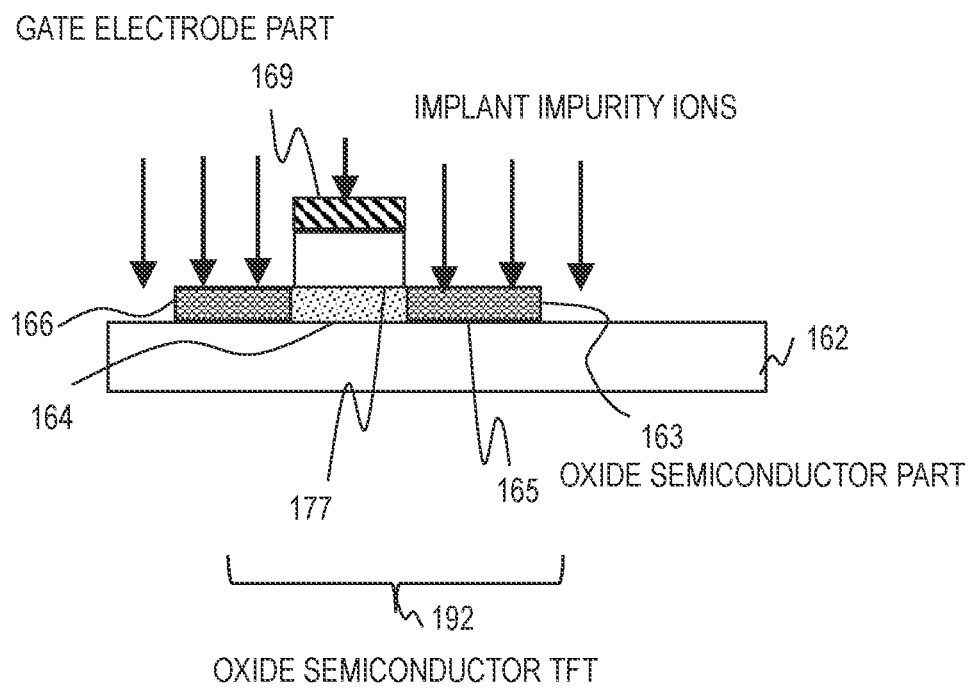
FIG. 7B illustrates another example of a method of manufacturing an oxide semiconductor TFT.

With reference to FIG. 7B, the manufacturing method produces a gate insulating part 177 by etching the insulating layer 176 using the gate electrode part 169 as a mask. Through this process, the insulating layer 176 in the part uncovered with the gate electrode part 169 is removed and the oxide semiconductor part 163 thereunder is exposed.

Subsequently, the manufacturing method implants impurity (for example, boron) into the oxide semiconductor part 163. The implantation of impurity ions produces low-resistive regions 165 and 166 in the oxide semiconductor part 163. These regions correspond to the source/drain regions of an oxide semiconductor TFT 192. The region between the source/drain regions 165 and 166 corresponds to a channel region 164.

The acceleration voltage for the impurity ions can be from 10 keV to 30 keV. As will be described later, the concentration profile of the impurities in an embodiment of this specification has a peak at a location outside the oxide semiconductor part 163.

Figure 7C:
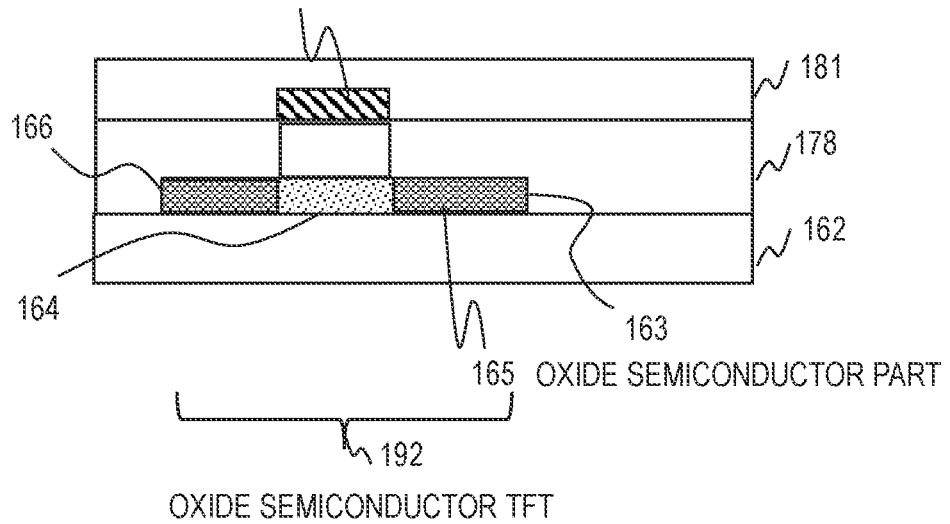
FIG. 7C illustrates another example of a method of manufacturing an oxide semiconductor TFT.
Figure 7D:
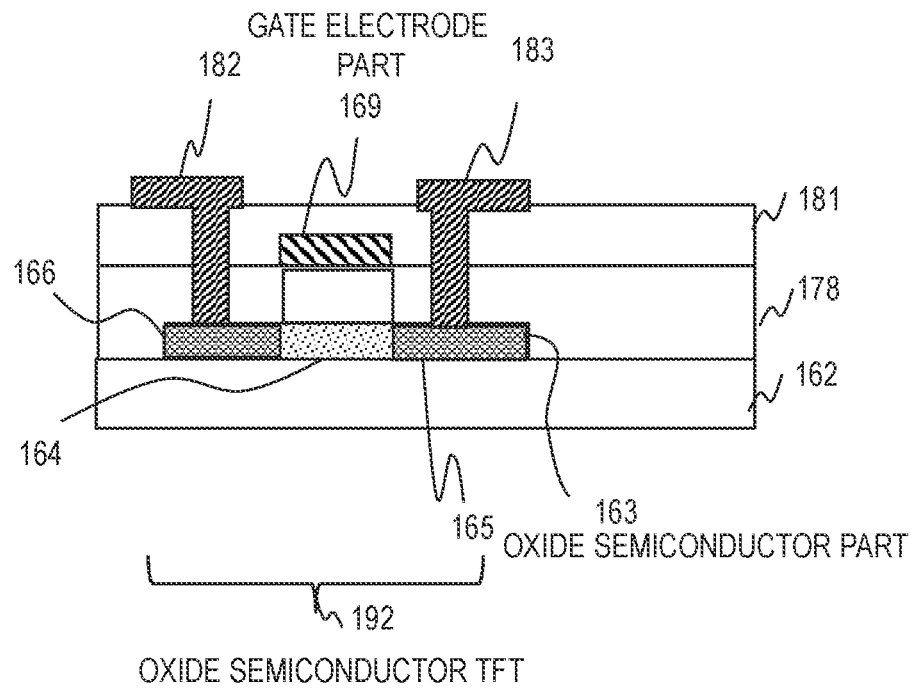
FIG. 7D illustrates another example of a method of manufacturing an oxide semiconductor TFT.

With reference to FIG. 7C, the manufacturing method produces an interlayer insulating film 181 to cover the gate electrode part 169 and the insulating layer 178. The interlayer insulating film 181 can be produced by CVD. With reference to FIG. 7D, the manufacturing method opens contact holes in the interlayer insulating film 181 and the insulating layer 178 by etching with a mask patterned by photolithography. Further, the manufacturing method deposits a metal film by sputtering and forms source/drain electrode parts 182 and 183 by etching the metal film with a mask patterned by photolithography.

Concentration Profile of Impurities

Hereinafter, the concentration profile of the impurities in an oxide semiconductor TFT is described. The oxide semiconductor TFT in an embodiment of this specification has low-resistive regions produced by impurity ion implantation in the oxide semiconductor part. Examples of impurity elements selected to cause resistance reduction include B, He, Ne, Ar, H, and P.

Figure 8:
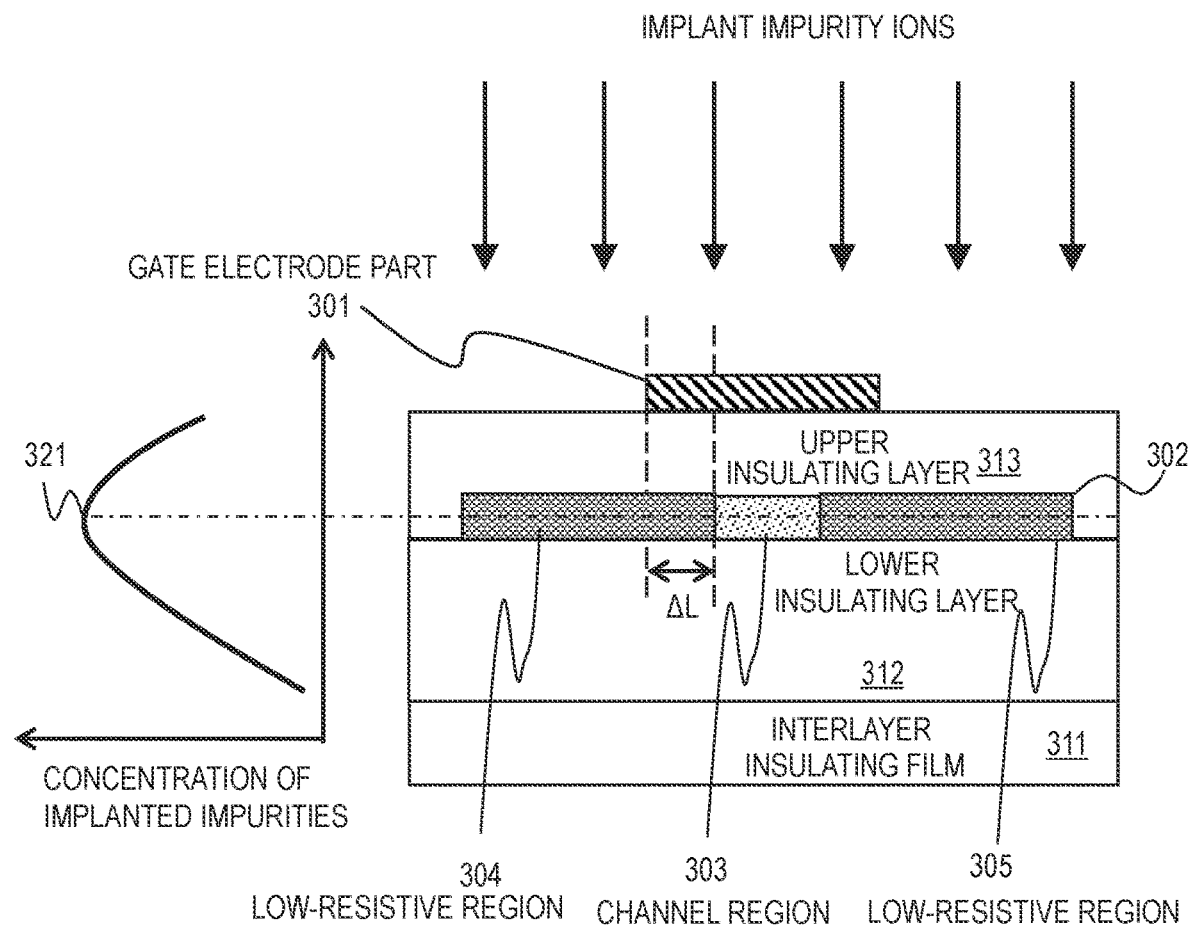
FIG. 8 illustrates implantation of impurity ions into an oxide semiconductor TFT in a related art example.

FIG. 8 illustrates implantation of impurity ions into an oxide semiconductor TFT in a related art example. An interlayer insulating film 311 and a lower insulating layer 312 are layered on a not-shown substrate. The oxide semiconductor TFT includes an oxide semiconductor part 302 above the lower insulating layer 312. The oxide semiconductor TFT has a top-gate structure and includes a gate electrode part 301 above the oxide semiconductor part 302. An upper insulating layer 313 is provided between the oxide semiconductor part 302 and the gate electrode part 301. The part of the upper insulating layer 313 located between the gate electrode part 301 and the oxide semiconductor part 302 corresponds to a gate insulating part.

The impurity ion implantation is performed under the state illustrated in FIG. 8, so that low-resistive regions 304 and 305 are produced in the oxide semiconductor part 302. The region sandwiched between the low-resistive regions 304 and 305 in an in-plane direction is a channel region 303 having high resistance.

FIG. 8 schematically illustrates a concentration profile in the layering direction of the implanted impurity ions. The impurity concentration profile in the example of FIG. 8 has one peak 321 and the peak 321 is located within the oxide semiconductor part 302.

The resistance of the n-type low-resistive regions 304 and 305 depends on the concentration of oxygen defects in the oxide semiconductor part 302 generated because of the damage by impurity ion implantation. In the configuration where the impurity concentration has a peak 321 in the oxide semiconductor part 302 as illustrated in FIG. 8, the value $\Delta L$ is too large for the oxide semiconductor TFT to have a short channel. The value $\Delta L$ is the length of the overlap region of the low-resistive region with the gate electrode part 301 (the distance from an end of the gate electrode part 301 to the end of the low-resistive region located under the gate electrode part 301) when viewed planarly. When the value $\Delta L$ is 0, the channel length L is equal to the length of the gate electrode part 301.

As to a low-temperature polysilicon TFT, the resistance of a p-type low-resistive low-temperature polysilicon part depends on the concentration of impurities remaining in the low-temperature polysilicon part. Accordingly, the impurity concentration profile is controlled to have a peak in the low-temperature polysilicon part. Examples of the impurities can be boron (B) or phosphorous (P). The impurity ion implantation into an oxide semiconductor, however, produces low-resistive regions by damaging the oxide semiconductor layer, as described above. Accordingly, the location to show the peak of the impurity concentration can be selected more flexibly than in implanting impurity ions into low-temperature polysilicon.

An embodiment of this specification controls the impurity concentration profile so that the peak of the impurity concentration is located outside the oxide semiconductor layer, for example, above, below, or both above and below the oxide semiconductor layer. As a result, the value ΔL in the oxide semiconductor part can be made small.

Figure 9A:
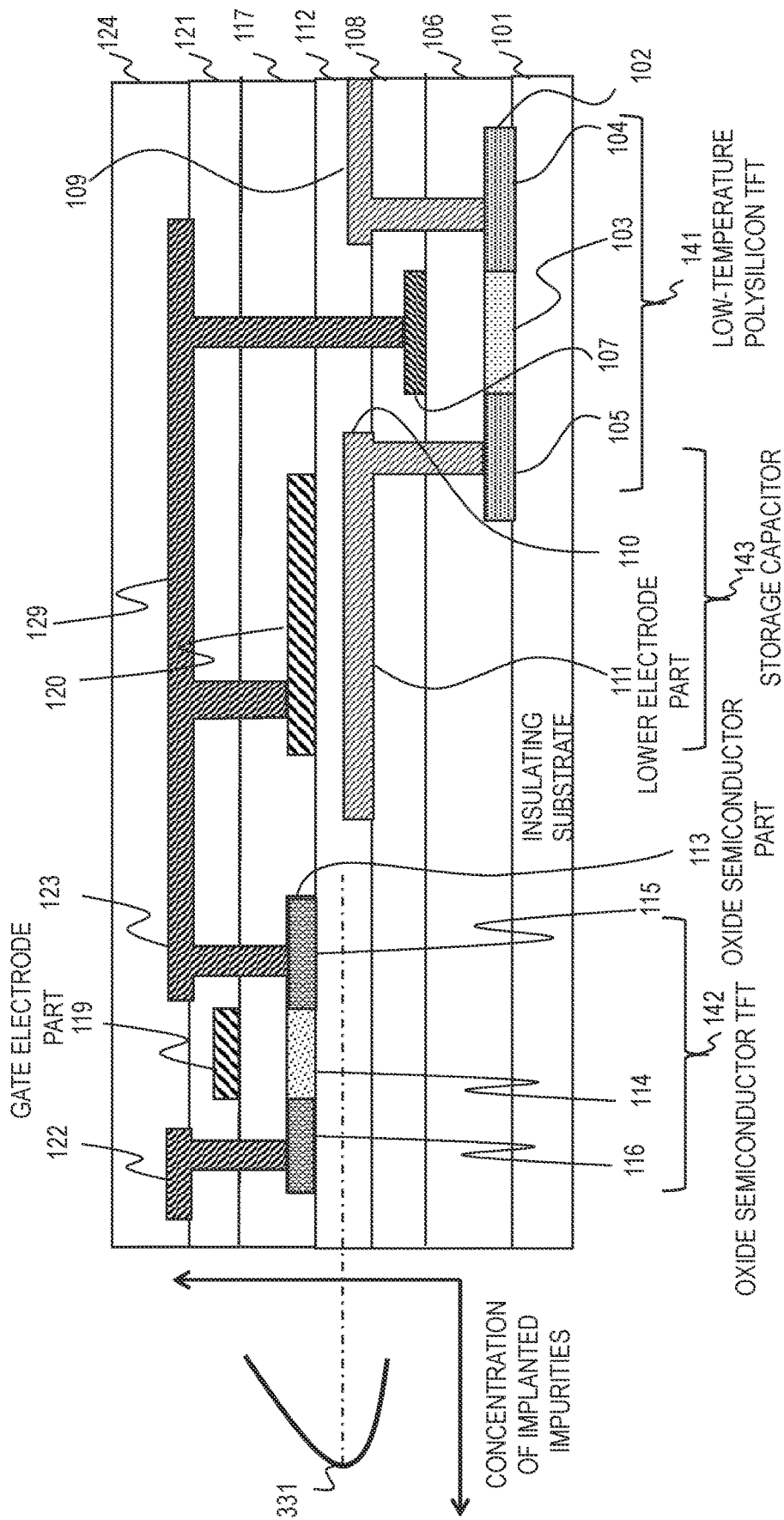
FIG. 9A illustrates an example of the concentration profile of impurities in an oxide semiconductor TFT and its proximity in an embodiment of this specification.

FIG. 9A illustrates an example of the concentration profile of impurities in an oxide semiconductor TFT and its proximity in an embodiment of this specification. The circuit configuration in FIG. 9A is the same as the circuit configuration example illustrated in FIG. 3. Some elements in the configuration example in FIG. 3 are excluded from FIG. 9A. The following description is applicable to the CMOS circuit described with reference to FIG. 5.

The concentration profile of impurities in FIG. 9A has only one peak 331. The peak concentration of the impurities can be between 1E18 atoms/cc and 1E21 atoms/cc. The peak 331 of the impurity concentration is located within the interlayer insulating film 112 under the oxide semiconductor part 113. The interlayer insulating film 112 is an example of a lower insulating layer. The location of the peak 331 of the impurity concentration can be adjusted by controlling the acceleration voltage for the impurity ions. The concentration of the impurities can be adjusted by controlling the quantity of impurities. In an example, the distance between the location having the peak 331 of the impurity concentration and the center of the oxide semiconductor part 113 in the layering direction is larger than the thickness of the oxide semiconductor part 113.

The configuration example in FIG. 9A includes not only the oxide semiconductor TFT 142 but also a low-temperature polysilicon TFT 141 located lower than the oxide semiconductor TFT 142. For the low-temperature polysilicon TFT 141, the concentration profile of impurities is controlled so that the peak of the impurity concentration is located within the low-temperature polysilicon part. The concentration profile of the impurities can be adjusted by controlling the acceleration voltage for the impurity ions.

The low-temperature polysilicon TFT 141 can have more appropriate characteristics by terminating the dangling bonds of the low-temperature polysilicon with hydrogen. For this reason, some insulating layer, for example, the interlayer insulating film 108, may be made of hydrogen-containing silicon nitride. Meanwhile, in the case where the circuit is fabricated on a flexible polyimide substrate, a silicon nitride layer is provided to prevent moisture from propagating.

The configuration example illustrated in FIG. 9A has a peak of impurity concentration in the interlayer insulating film 112 located lower than the oxide semiconductor part 113. Employing an insulator different from silicon nitride, for example, silicon oxide, for the interlayer insulating film 112 reduces the diffusion of hydrogen from the silicon nitride layer located lower than the interlayer insulating film 112 to the oxide semiconductor part. Especially, using boron (B) as impurities achieves higher effect to reduce the diffusion of hydrogen. A boron-rich interlayer insulating film 112 further exhibits high tolerance to impacts.

Figure 9B:
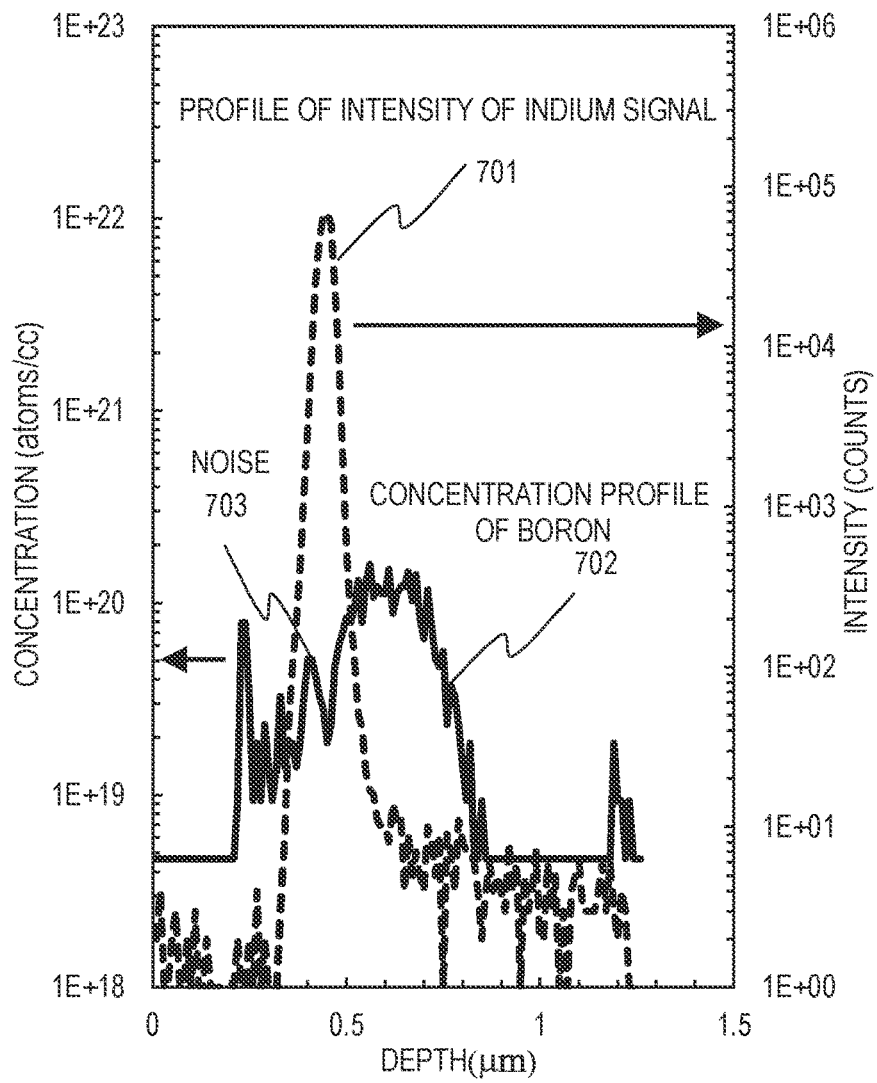
FIG. 9B provides an example of a measured concentration profile of boron in an IGZO TFT and its proximity in an embodiment of this specification.

FIG. 9B provides an example of a measured concentration profile of boron in an IGZO TFT and its proximity in an embodiment of this specification. FIG. 9B includes a concentration profile 702 of boron and a profile 701 of the intensity of a signal caused by indium. The peak of the intensity of the signal caused by indium corresponds to the location in the depth of the IGZO film. The point 703 in the concentration profile 702 of boron is the peak of the signal caused by noise and not the peak of the concentration.

Accordingly, FIG. 9B provides an example of a measurement result on an embodiment in which the peak of boron concentration is located lower than the IGZO film. As noted from this measurement result, when the peak of boron concentration is located lower than the IGZO film, diffusion of hydrogen from a film lower than the location of this peak (for example, the silicon nitride layer) to the IGZO film can be reduced to stabilize the characteristics of a short-channel TFT.

Figure 9C:
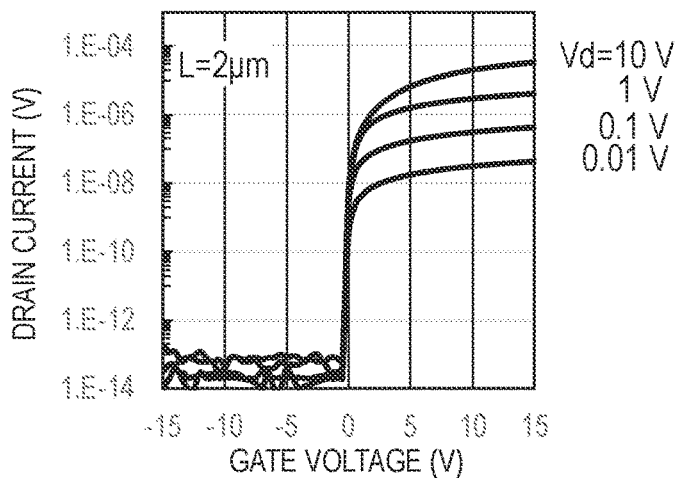
FIG. 9C provides measurement results on an oxide semiconductor TFT in an embodiment of this specification.

FIG. 9C provides measurement results on an oxide semiconductor TFT in an embodiment of this specification. The horizontal axis represents gate voltage and the vertical axis represents drain current. FIG. 9C shows measurement results on a short-channel TFT having a gate length L of 2 μm. FIG. 9C indicates that the oxide semiconductor TFT in this embodiment works properly even though it is a short-channel TFT.

Figure 10A:
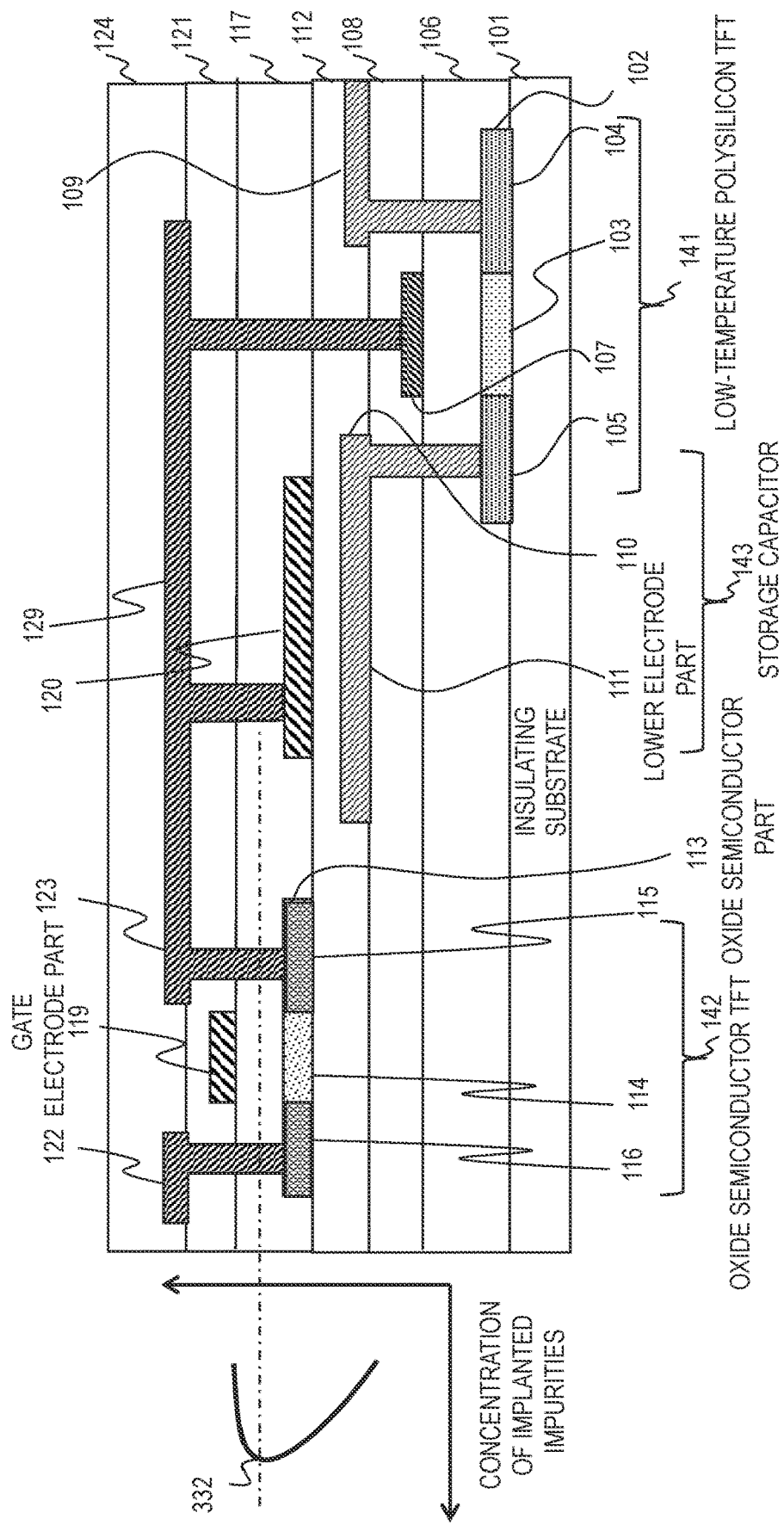
FIG. 10A illustrates an example of the concentration profile of impurities in an oxide semiconductor TFT and its proximity in another embodiment of this specification.

FIG. 10A illustrates an example of the concentration profile of impurities in an oxide semiconductor TFT and its proximity in another embodiment of this specification. The circuit configuration in FIG. 10A is the same as the circuit configuration example illustrated in FIG. 3. Some elements in the configuration example in FIG. 3 are excluded from FIG. 10A. The following description is applicable to the CMOS circuit described with reference to FIG. 5.

The concentration profile of impurities in FIG. 10A has only one peak 332. The concentration peak of the impurities can be between 1E18 atoms/cc and 1E21 atoms/cc. The peak 332 of the impurity concentration is located within the insulating layer 117 above the oxide semiconductor part 113. The insulating layer 117 is an example of an upper insulating layer. The location of the peak 332 of the impurity concentration can be adjusted by controlling the acceleration voltage for the impurity ions. The concentration of the impurities can be adjusted by controlling the quantity of impurities. In an example, the distance between the location having the peak 332 of the impurity concentration and the center of the oxide semiconductor part 113 in the layering direction is larger than the thickness of the oxide semiconductor part 113.

The configuration example in FIG. 10A has a peak of impurity concentration in the insulating layer 117 located upper than the oxide semiconductor part 113. Accordingly, effect of etching solution onto the oxide semiconductor part in the manufacturing process is reduced. Especially, using boron (B) as impurities increases the reduction.

The configuration examples described with reference to FIGS. 9A and 10A have only one peak in the impurity concentration. The impurity concentration in another configuration example can have a plurality of peaks (of a maximum value). All of the peaks are located outside the oxide semiconductor part.

Figure 10B:
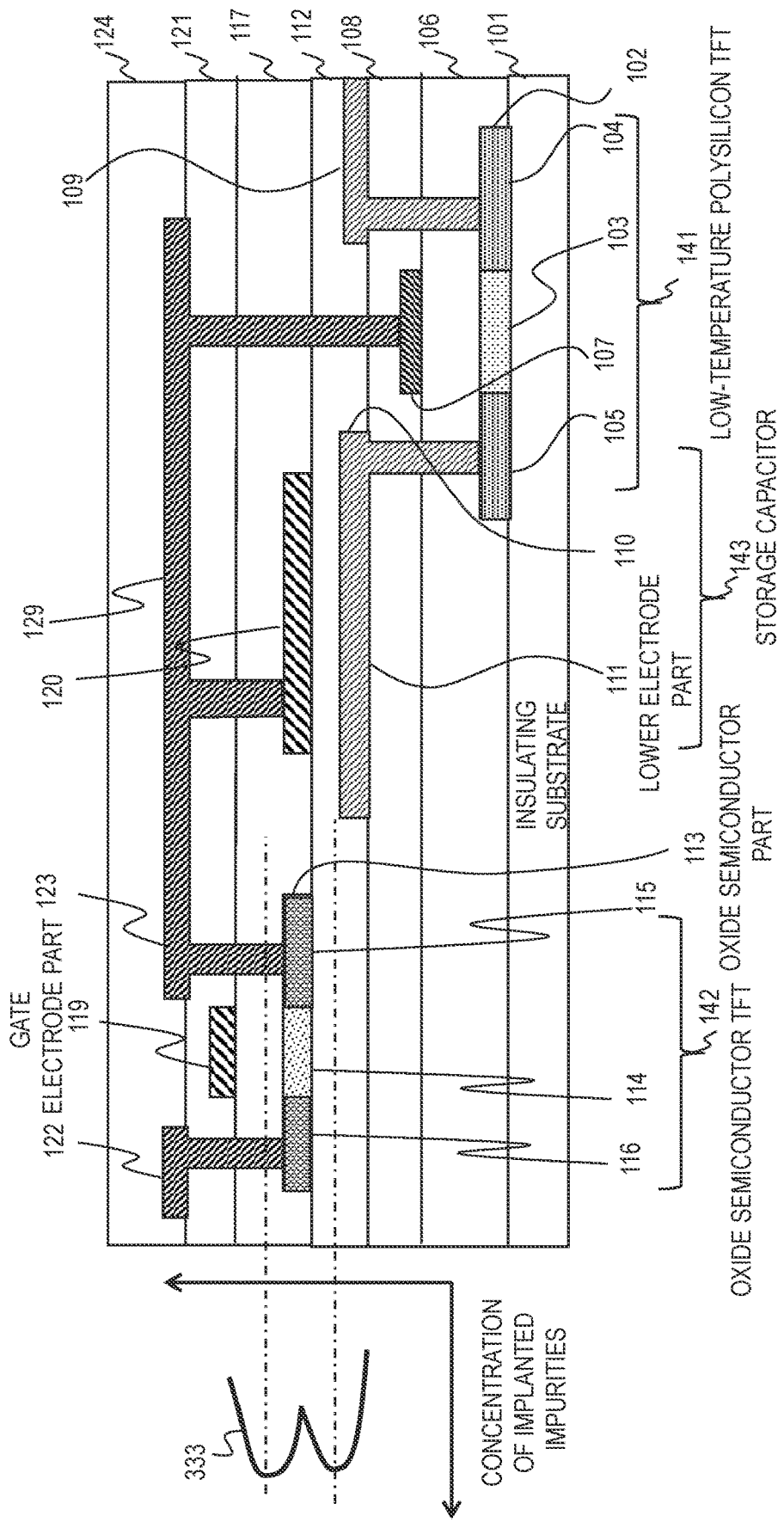
FIG. 10B illustrates an example of the concentration profile of impurities in an oxide semiconductor TFT and its proximity in still another embodiment of this specification.

FIG. 10B illustrates an example of the concentration profile of impurities having two peaks. There are two peaks in the impurity concentration profile 333; one of them is located within the interlayer insulating film 112 and the other one is located within the insulating layer 117. This configuration reduces the adverse effects onto the oxide semiconductor from the layers upper and lower than the oxide semiconductor part. This impurity concentration profile having two peaks can be attained by implanting impurity ions twice at different acceleration voltages.

In the examples illustrated in FIGS. 3, 5, 9A, 10A, and 10B, the gate insulating part of each TFT is a part of an insulating layer covering the whole display region. In another example, the gate insulating part can be produced by forming a gate insulating layer and etching the gate insulating layer thereafter. The insulating material for the gate insulating part can be different from the insulating material for the upper insulating layer surrounding it, for example, the interlayer insulating film. The low-resistive regions are in direct contact with the upper insulating layer.

Carrier Density Profile

Next, the carrier density profile in an in-plane direction of the oxide semiconductor layer is described. The in-plane direction is a direction parallel to the main plane of the substrate and perpendicular to the layering direction. First, the relation between the carrier density and the dC/dV signal obtained by analyzing an n-type semiconductor by scanning capacitance microscopy (SCM) is described. In the term dC/dV, C represents the capacitance of the local MOS generated between the conductive scanning probe and the oxide semiconductor and V represents the voltage applied to the conductive probe.

Figure 11:
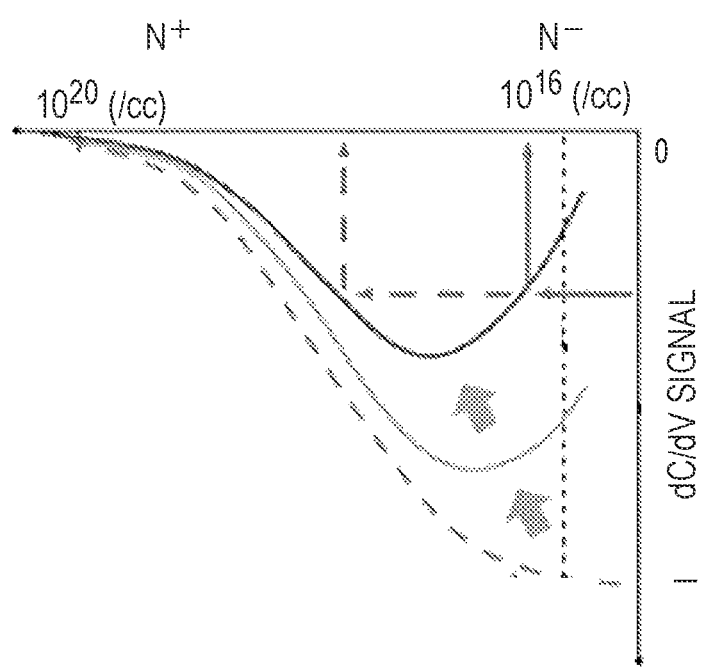
FIG. 11 schematically illustrates relations between dC/dV signals obtained by SCM analysis of n-type semiconductors and the carrier density.

FIG. 11 schematically illustrates relations between dC/dV signals obtained by SCM analysis of n-type semiconductors and the carrier density. The horizontal axis represents the carrier density and the vertical axis represents the dC/dV signal value. The dC/dV signal value takes negative values when the carrier density is between high density and low density.

Each dC/dV signal value gradually decreases from the low carrier density ($N^-$) toward the high carrier density ($N^+$), takes a smallest value at a specific carrier density, and then gradually increases. The carrier density taking the smallest value depends on the material of the n-type semiconductor.

Figure 12:
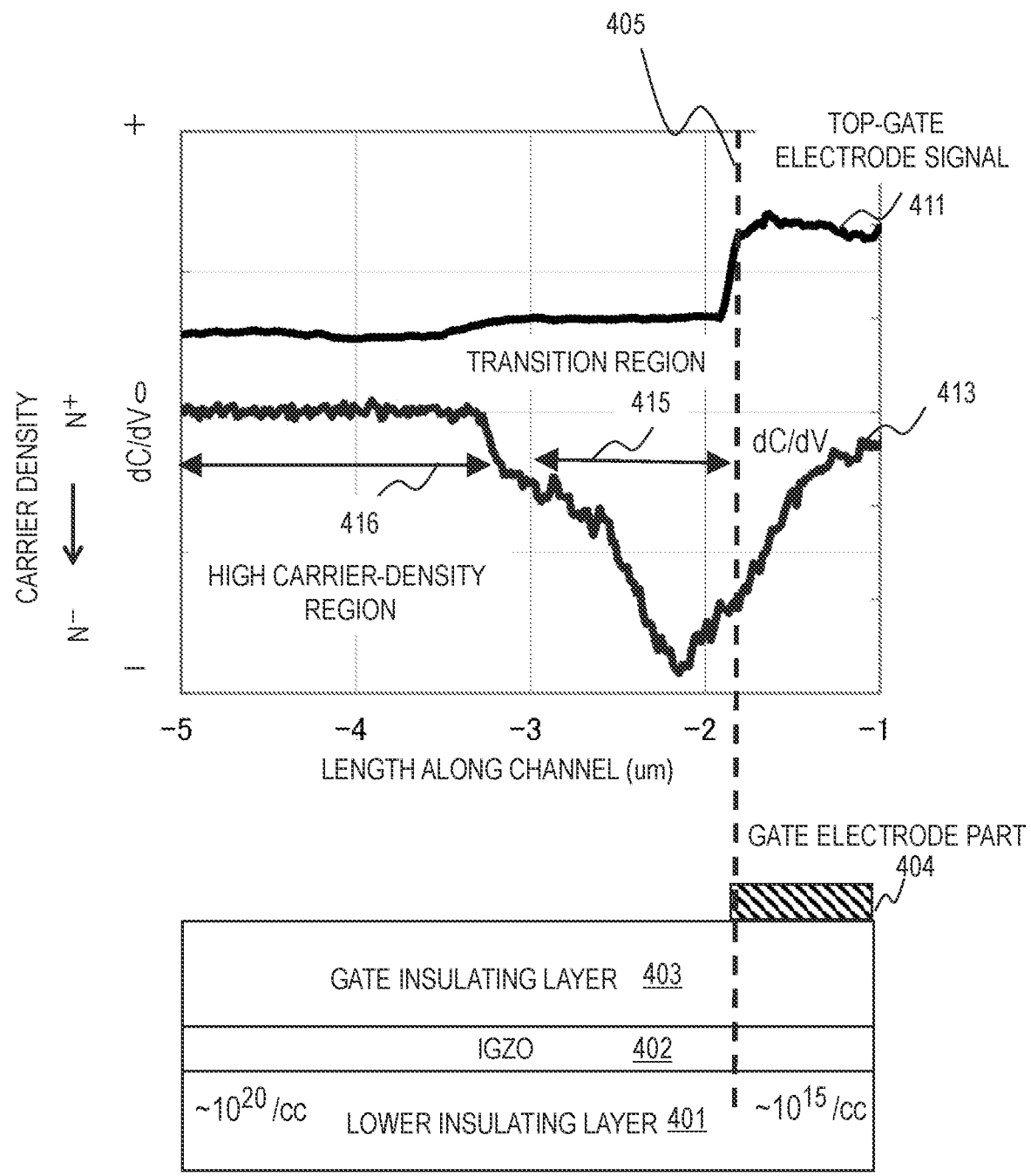
FIG. 12 illustrates variation in dC/dV signal value in an oxide semiconductor layer in an embodiment of this specification.

FIG. 12 illustrates variation in dC/dV signal value in the oxide semiconductor layer in an embodiment of this specification. IGZO is used as an example of the oxide semiconductor. FIG. 12 illustrates variation in dC/dV signal value in a proximity of an end of the top-gate electrode part of an oxide semiconductor TFT having a top-gate structure.

The oxide semiconductor TFT includes an IGZO layer 402 laid above a lower insulating layer 401, a gate insulating layer 403 laid above the IGZO layer 402, and a top-gate electrode part 404 laid above the gate insulating layer 403.

The graph in FIG. 12 includes a top-gate electrode signal 411 and a dC/dV signal value 413. As described above, the dC/dV signal value represents the carrier density. The horizontal axis represents the length along the channel and the vertical axis represents the dC/dV signal value. The dC/dV signal value 413 includes a transition region 415 and a high carrier-density region 416 outside the top-gate electrode part 404. The dC/dV signal value 413 gradually increases and approaches 0 from an end 405 of the top-gate electrode part 404 toward the center of the top-gate electrode part 404.

The high carrier-density region 416 can be a region where the carrier density ranges from 1E19/cc to 1E21/cc. The transition region 415 is located between the high carrier-density region 416 and the end 405 of the top-gate electrode part 404. The length of the transition region 415 can be between 0.2 µm and 2.5 µm.

The transition region is a region where the carrier density varies from low concentration to high concentration in a carrier density profile of the IGZO located from the end 405 of the top-gate electrode part 404 toward a source/drain electrode part. As illustrated in FIG. 12, the dC/dV signal value takes the smallest value outside the top-gate electrode part 404, more particularly, within the transition region 415. The carrier density profile having a transition region 415 starting from the end 405 of the top-gate electrode part 404 provides characteristics more appropriate for the oxide semiconductor TFT.

Figure 13:
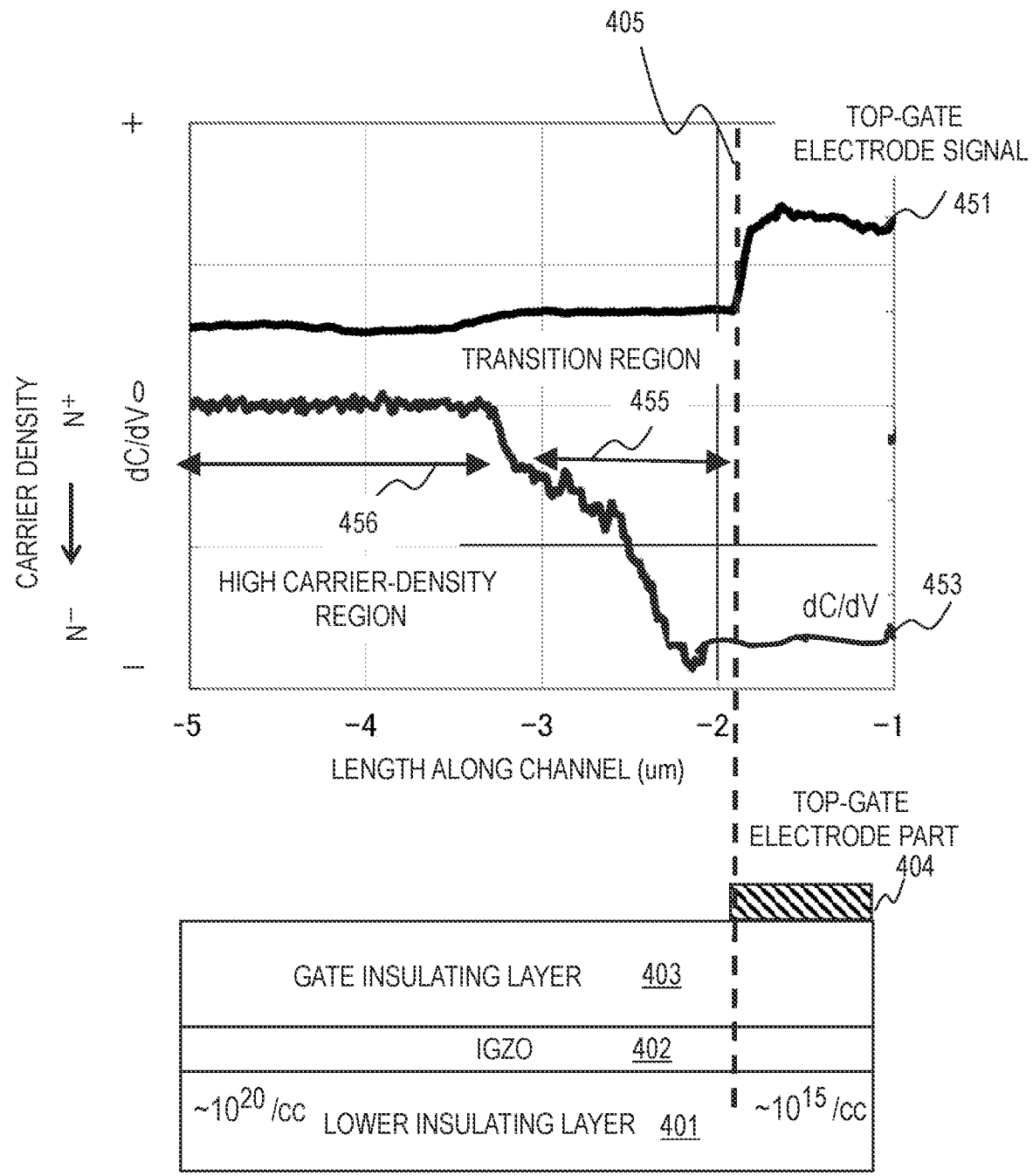
FIG. 13 illustrates variation in dC/dV signal value in an oxide semiconductor layer in another embodiment of this specification.

FIG. 13 illustrates variation in dC/dV signal value in the oxide semiconductor layer in another embodiment of this specification. IGZO is used as an example of the oxide semiconductor. FIG. 13 illustrates variation in dC/dV signal value in a proximity of an end of the top-gate electrode part of an oxide semiconductor TFT having a top-gate structure. The structure of the oxide semiconductor TFT is the same as the one in the example of FIG. 12.

The graph in FIG. 13 includes a top-gate electrode signal 451 and a dC/dV signal 453. The horizontal axis represents the length along the channel and the vertical axis represents the dC/dV signal value. The dC/dV signal value 453 includes a transition region 455 and a high carrier-density region 456 outside the top-gate electrode part 404. The dC/dV signal value 453 is substantially constant from an end 405 of the top-gate electrode part 404 toward the center of the top-gate electrode part 404.

The high carrier-density region 456 can be a region where the carrier density ranges from 1E19/cc to 1E21/cc. The transition region 455 is located between the high carrier-density region 456 and the end 405 of the top-gate electrode part 404. The length of the transition region 455 can be between 0.2 µm and 2.5 µm.

The transition region is a region where the carrier density varies from low concentration to high concentration in a carrier density profile of the IGZO located from the end 405 of the top-gate electrode part 404 toward a source/drain electrode part. As illustrated in FIG. 13, the dC/dV signal value takes the smallest value outside the top-gate electrode part 404, more particularly, within the transition region 455. The carrier density profile having a transition region 455 starting from the end 405 of the top-gate electrode part 404 provides characteristics more appropriate for the oxide semiconductor TFT. It is satisfactory if either one of the carrier density profile described with reference to FIG. 12 or 13 and the impurity concentration profile described with reference to FIG. 9A or 10A is established.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thin-film transistor substrate comprising:
    an insulating substrate; and
    a conductor including a top-gate electrode part of an oxide semiconductor thin-film transistor;

an oxide semiconductor layer located lower than the top-gate electrode part and including a channel region of the oxide semiconductor thin-film transistor; and an upper insulating layer located between the conductor layer and the oxide semiconductor layer, wherein the oxide semiconductor layer includes low-resistive regions lower in resistance than the channel region, wherein the low-resistive regions sandwich the channel region in an in-plane direction of the insulating substrate and contain impurities to cause resistance reduction of the low-resistive regions, wherein a concentration profile in a layering direction of the impurities to cause resistance reduction of the low resistive regions has one or more peaks, wherein the one or more peaks are located outside the oxide semiconductor layer, and wherein a distance between a location having a peak closest to the oxide semiconductor layer among the one or more peaks and the center of the oxide semiconductor layer in the layering direction is not less than a thickness of the oxide semiconductor layer.

2. The thin-film transistor substrate according to claim 1, wherein one of the one or more peaks is located within the upper insulating layer.

3. The thin-film transistor substrate according to claim 1, wherein the impurities to cause resistance reduction is boron.

4. The thin-film transistor substrate according to claim 1, further comprising a lower insulating layer located lower than the oxide semiconductor layer, wherein one of the one or more peaks is located within the lower insulating layer.

5. The thin-film transistor substrate according to claim 4, wherein the one or more peaks are a first peak and a second peak, wherein the one of the one or more peaks is the first peak, and wherein the second peak is located within the upper insulating layer.

6. The thin-film transistor substrate according to claim 4, further comprising:

a polysilicon layer located lower than the lower insulating layer and including a channel region of a polysilicon thin-film transistor; and a hydrogen-containing silicon nitride layer located between the polysilicon layer and the lower insulating layer.

* * * * *